United States Patent [19]
Sakai et al.

[11] Patent Number: 6,071,338
[45] Date of Patent: Jun. 6, 2000

[54] METHOD FOR CRYSTAL GROWTH OF MULTI-ELEMENT OXIDE THIN FILM CONTAINING BISMUTH AS CONSTITUENT ELEMENT

[75] Inventors: Shigeki Sakai; Shinji Migita, both of Tsukuba, Japan

[73] Assignee: Agency of Industrial Science & Technology, Tokyo, Japan

[21] Appl. No.: 08/977,799

[22] Filed: Nov. 25, 1997

[30] Foreign Application Priority Data

Nov. 29, 1996 [JP] Japan ................................ 8-318974

[51] Int. Cl.[7] .................................................. C30B 25/02
[52] U.S. Cl. .............................. 117/89; 117/92; 117/93; 117/944; 505/230; 505/236
[58] Field of Search ................................ 117/89, 92, 93, 117/944; 525/230, 236

[56] References Cited

U.S. PATENT DOCUMENTS

| 5,118,662 | 6/1992 | Agostinelli et al. ...................... 505/781 |
| 5,189,010 | 2/1993 | Strom et al. ............................... 505/737 |
| 5,439,845 | 8/1995 | Watanabe et al. ......................... 437/130 |

FOREIGN PATENT DOCUMENTS

| 0 347 335 A2 | 6/1989 | European Pat. Off. .................... 39/24 |
| 0 590 560 A2 | 9/1993 | European Pat. Off. .................... 39/12 |

OTHER PUBLICATIONS

Suzuki et al,. "Preparation and properties for superconducting BaPbBiO thin films by sputtering", Journal of Applied Physics, vol. 53(3) pp. 1622–1630, Mar. 1982.

Suzuki et a;., "Superconducting BaPbBiO thin Films by RF magnetron sputtering", Japanese Journal of Applied Physics vol. 22 No. 12 pp. 1794–1800, Dec. 1983.

Y. Nakayama, I. Tsukada, and K. Uchinokura, Superconductivity of $Bi(2)Sr(2)Ca(n-1)Cu(n)O(y)$ (n=2, 3, 4, and 5) Thin Films Prepared in Situ by Molecular–Beam Epitaxy Technique, J. Appl. Phys. 70 (1991), pp. 4371–4377.

Shigeki Sakai, Yujii Kasai, Peter Bodin, and Hirofumi Matsuhata, Rheed Intensity Monitored Growth of Bi–Sr–Ca–Cu–O Superconductors, in: Layered Superconductors: Fabracation, Properties, and Applications, edited by D.T. Shaw, C.C. Tsuei, T.R. Schneider, and Y. Shiohara, vol. 275 (Materials Research Society, Pittsburgh, 1992), pp. 73–78.

Y. Kasai, A Suzuki, H. Tanoue, T. Nagi, and S. Sakai, MBE Growth of BiSrCaCuO Films Using Flux Monitoring by Atomic Absorption Spectroscopy, in: Advances in Superconductivity VII, edited by K. Yamafuji and T. Morishita (Springer–Verlag, Tokyo, 1995), pp. 897–900.

*Primary Examiner*—Robert Kunemund
*Attorney, Agent, or Firm*—Workman, Nydegger & Seeley

[57] ABSTRACT

A method for crystal growth of a multi-element oxide thin film containing bismuth as a constituent element has setting a growth environment to fall under conditions such that an oxide of bismuth alone will not be formed, but the desired multi-element oxide will be formed; and supplying bismuth in excess of other elements to the growth environment, to prevent the lack of bismuth and evaporate surplus bismuth from the thin film. This method suppresses the formation of different phases or the precipitation of impurities ascribed to the deviation of the proportion of bismuth element from the desired composition, enables a high quality thin film to be grown, and markedly broadens the ranges of the set conditions for the thin film growth temperature and oxidizing gas in comparison with conventional technologies.

15 Claims, 6 Drawing Sheets

METHOD FOR CRYSTAL GROWTH OF MULTI-ELEMENT OXIDE THIN FILM CONTAINING BISMUTH AS CONSTITUENT ELEMENT

This application is based on Patent Application No. 08-318,974 filed Nov. 29, 1996 in Japan, the content of which is incorporated fereinto by reference.

BACKGROUND OF THE INVENTION

1. Field of the Invention

The present invention relates to a method for crystal growth utilizing the self-growth-limiting function of bismuth element in the production of a multi-element oxide thin film containing bismuth as a constituent element by vapor phase epitaxy.

2. Description of the Prior Art

As methods for preparing a multi-element oxide thin film by vapor phase epitaxy, sputtering, laser ablation, molecular beam epitaxy, and chemical vapor deposition (CVD) have been developed and have found use. The sputtering method and the laser ablation method use a target with a predetermined chemical composition, while the molecular beam epitaxial method and the CVD method maintain the feed ratios of the constituent elements of a thin film at constant values and grow the crystals of the thin film.

When a multi-element oxide thin film containing bismuth as a constituent element is prepared by a conventional technique, the uptake of bismuth element by the crystals of the thin film is low and sensitively varies with the growth temperature. Thus, the optimum environment for growth is limited to a narrow region, and the bismuth proportion in the thin film often becomes less than in the composition of the desired oxide. Furthermore, a thin film comprising a plurality of crystal phases, being different from the desired crystal phase, may grow, or impurities may precipitate in the thin film. These are major problems with the crystal growth of a multi-element oxide thin film containing bismuth as a constituent element, and pose a serious threat to improving the quality of the thin film. Even if the conditions for the growth temperature or oxidizing gas that can minimize these problems are discovered, they are limited to very narrow ranges. This makes it difficult to reproduce a thin film having the same level of quality.

SUMMARY OF THE INVENTION

An object of the present invention is, therefore, to provide a method for crystal growth of a multi-element oxide thin film containing bismuth as a constituent element, which suppresses the formation of different phases or the precipitation of impurities ascribed to the deviation of the proportion of bismuth element from the desired composition, which enables a high quality thin film to be grown, and which can markedly broaden the ranges of the set conditions for the thin film growth temperature and oxidizing gas in comparison with conventional technologies.

To attain this object, the invention concerns a method for crystal growth of a multi-element oxide thin film containing bismuth as a constituent element by vapor phase epitaxy, which utilizes the self-growth-limiting function of bismuth to prepare a high quality thin film free from mixing of crystal phases or precipitation of impurities that occurs for lack of bismuth.

That is, the method of the invention for crystal growth of a multi-element oxide thin film containing bismuth as a constituent element by vapor phase epitaxy comprises setting a growth environment to fall under conditions such that an oxide of bismuth alone will not be formed, but the desired multi-element oxide will be formed; and supplying bismuth in excess of other elements to the growth environment, to prevent the lack of bismuth and evaporate surplus bismuth from the thin film.

In the method of crystal growth of the invention, the growth environment may be controlled with the growth temperature and the amount of an oxidizing gas supplied being used as control factors to set conditions such that an oxide of bismuth alone will not be formed, but the desired multi-element oxide will be formed.

Of the composition of the multi-element oxide thin film, the proportion of each of the elements, especially oxygen may deviate from the stoichiometric mixture ratio.

The multi-element oxide may be an oxide of the chemical formula $Bi_2Sr_2CuO_6$, an oxide of the chemical formula $Bi_4Ti_3O_{12}$, an oxide of the chemical formula $Bi_2WO_6$, or an oxide of the chemical formula $Bi_2SrTa_2O_9$.

The supply of bismuth and other elements may be performed sequentially, or simultaneously, or by a combination of sequential supply and simultaneous supply.

A period of time during which the supply of bismuth and other elements is stopped may be provided.

The vapor phase epitaxial method may be molecular beam epitaxy, laser ablation, sputtering, or chemical vapor deposition (CVD).

The crystal growth method of the foregoing constitution supplies bismuth in excess, thereby preventing the lack of bismuth in the thin film. Surplus bismuth in the thin film evaporates. Thus, it becomes possible to realize the growth of a thin film in which the proportion of bismuth in the resulting thin film is consistent with the composition of the desired multi-element oxide thin film.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

Embodiments of the present invention will now be described in detail, but the invention is not limited thereto.

Figure 1:
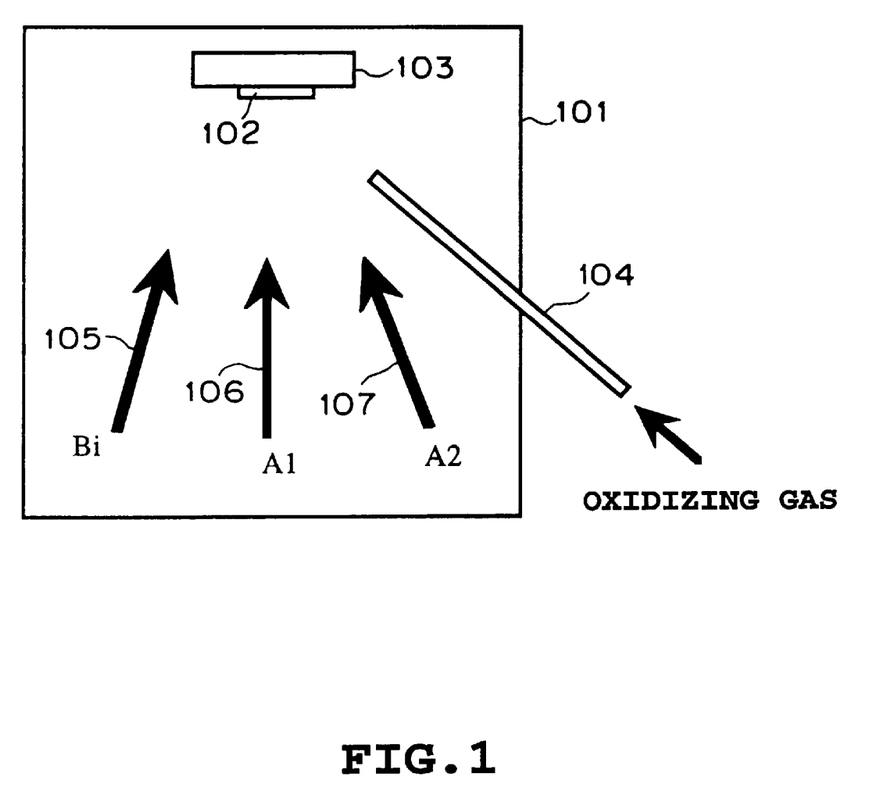
FIG. 1 is a structural view showing the material structure of a basic embodiment of a method for crystal growth of a multi-element oxide thin film containing bismuth as a constituent element related to the present invention.

FIG. 1 shows the material structure of a basic embodiment of the present invention. FIGS. 1 to 5 are views for illustrating a method for crystal growth of a multi-element oxide thin film containing bismuth as a constituent element according to the invention.

In FIG. 1, the numeral 101 denotes a vacuum apparatus for producing a thin film by vapor phase epitaxy, 102 a substrate for growth of a thin film, 103 a heater for maintaining the substrate at the growth temperature of the thin film, and 104 gas introducing means, optionally of a tubular shape as illustrated, for introducing an oxidizing gas into the vacuum apparatus. The oxidizing gas refers to a gas source for supplying oxygen into multi-element oxide crystals, such as oxygen gas, ozone gas, atomic oxygen gas, or ionized oxygen gas. The constituent elements other than bismuth in the multi-element oxide thin film are elements other than oxygen which can form a multi-element oxide with bismuth. Their number is not limited, but provided that their number is 2, these other elements are designated as A1 and A2. The numeral 105 represents the supply of bismuth element, 106 the supply of the constituent element A1, and 107 the supply of the constituent element A2.

Main factors for determining a growth environment for the preparation of the multi-element oxide thin film are the growth temperature set by the substrate heater 103, and the amount of an oxidizing gas introduced through the pipe (gas introducing means) 104.

The method of crystal growth by the present invention will be described below.

Figure 2:
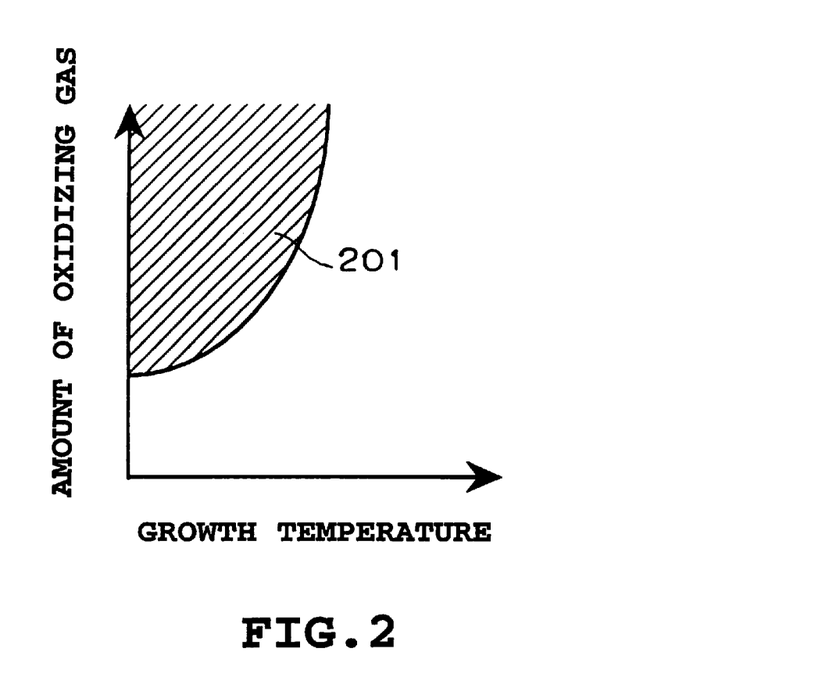
FIG. 2 is a graph representing a region in which the crystal growth of a thin film of an oxide of bismuth alone is possible.

When a thin film of an oxide of bismuth alone is to be prepared in a growth environment for vapor phase epitaxy of an oxide thin film, the environment where this thin film grows has its limits, as shown in FIG. 2. As the growth temperature is increased, for example, bismuth evaporates above a certain temperature, so that a thin film of an oxide of bismuth alone no more forms. An area indicated by a hatching 201 in FIG. 2 represents the growth environment where a thin film of an oxide of bismuth alone forms.

Figure 3:
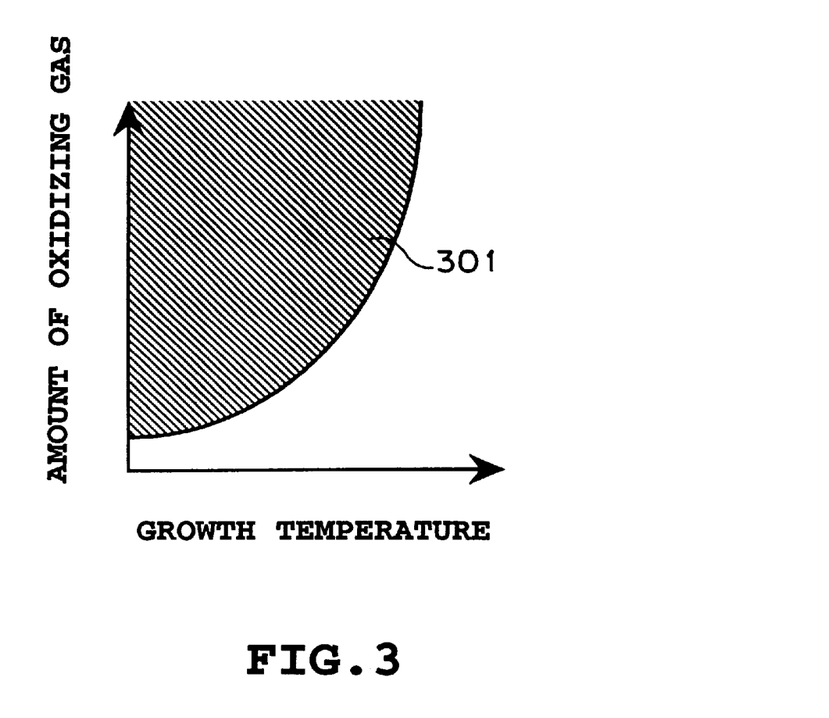
FIG. 3 is a graph representing a region in which the crystal growth of a multi-element oxide thin film containing bismuth as a constituent element is possible.

When a multi-element oxide thin film containing bismuth as a constituent element is to be prepared, on the other hand, a growth region in which a thin film can form is larger than in the above-mentioned case. This is shown in FIG. 3. As the growth temperature is raised, for example, a multi-element oxide thin film containing bismuth as a constituent element forms even in a temperature region in which a thin film of an oxide of bismuth alone does not form. An area indicated by a hatching 301 in FIG. 3 represents the growth environment where a multi-element oxide thin film containing bismuth as a constituent element forms.

Figure 4:
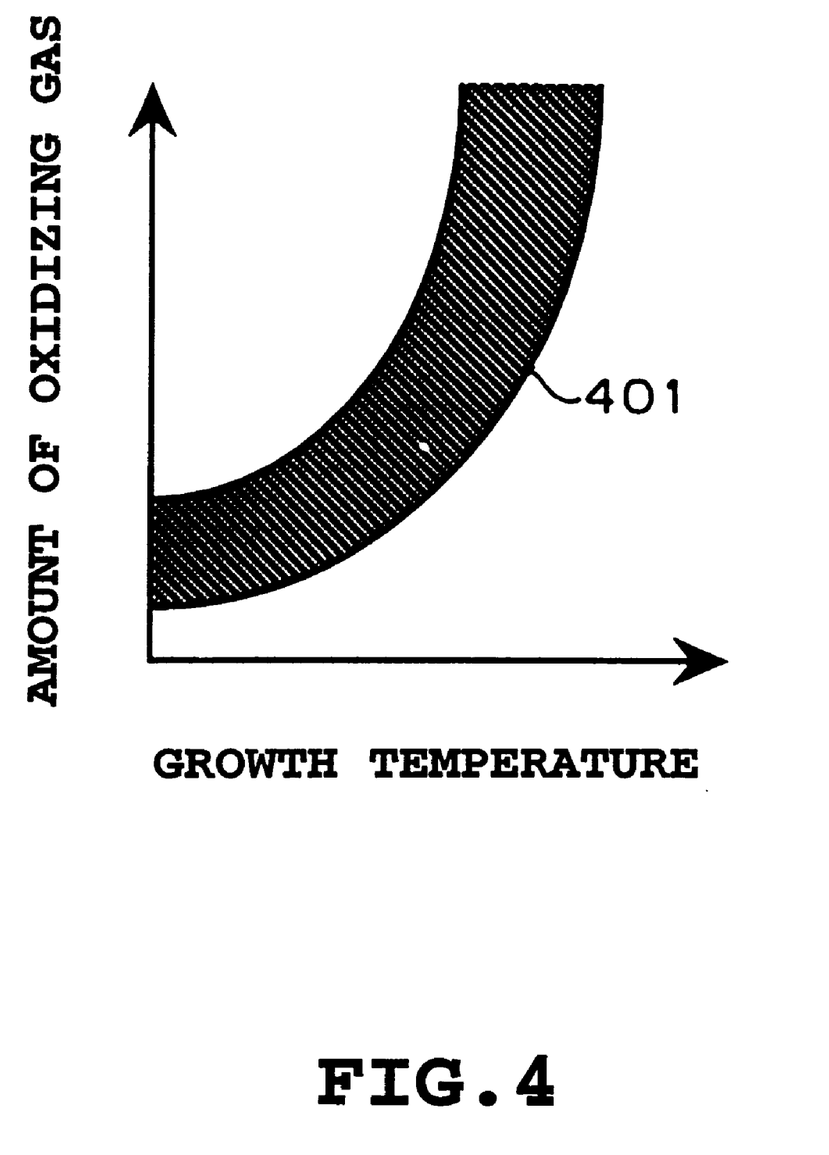
FIG. 4 is a graph showing a region remaining after superimposing FIGS. 2 and 3 on each other and removing the overlapping area, the region representing an environment in which an oxide of bismuth alone does not grow, while a multi-element oxide thin film containing bismuth as a constituent element can grow.

FIG. 4 is a view showing an area resulting after superimposing FIGS. 2 and 3 on each other and removing the overlapping part. In this area indicated by a hatching 401 in FIG. 4, a thin film of an oxide of bismuth alone does not grow, while a multi-element oxide thin film containing bismuth as a constituent element can grow. In this area 401, growth of a multi-element oxide thin film containing bismuth as a constituent element is carried out.

Figure 5:
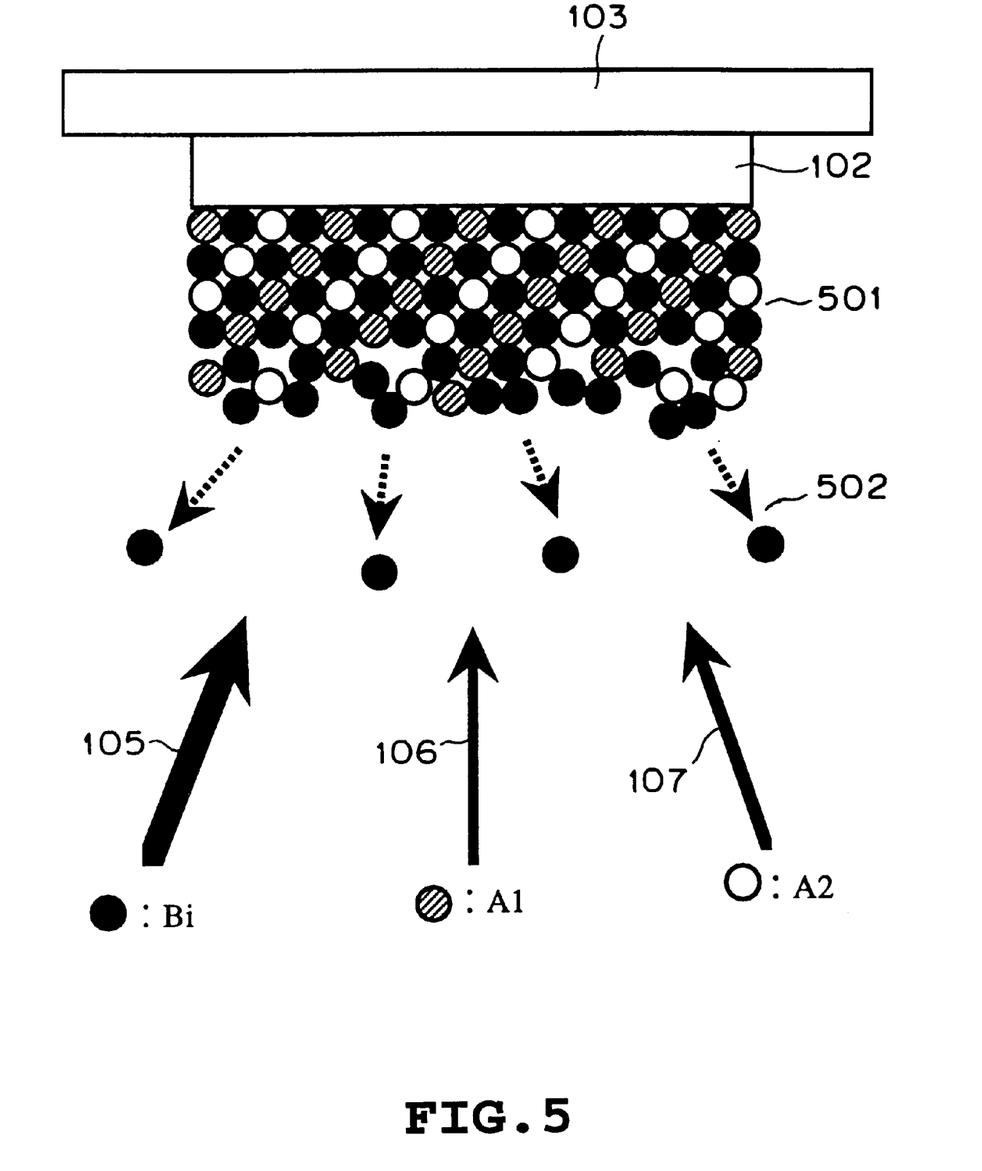
FIG. 5 is a schematic view showing a phenomenon which occurs during the production of a multi-element oxide thin film containing bismuth as a constituent element related to the present invention.

In setting a growth environment so as to lie in the area 401 in FIG. 4, thereby preparing a multi-element oxide containing bismuth as a constituent element, the supply amounts of the respective elements are set so that the amount of bismuth supplied will exceed those of other constituent elements. A phenomenon that occurs during thin film production in this case is shown in FIG. 5. In FIG. 5, oxidizing gas molecules in a vapor phase or oxygen atoms in the multi-element oxide thin film are omitted for simplification.

By supplying bismuth in excess, lack of bismuth in the resulting film can be prevented. In FIG. 5, the numeral 501 denotes the growth of a multi-element oxide thin film containing bismuth as a constituent element. Since the amount of bismuth supplied is in excess, there is no lack of bismuth element in this thin film. In the growth environment indicated as the area 401 in FIG. 4, an oxide of bismuth alone cannot exist stably. Of the excess bismuth element supplied to the thin film, therefore, the bismuth that was not incorporated into the multi-element oxide thin film evaporates out of the thin film. The numeral 502 in FIG. 5 represents the surplus bismuth evaporating from the thin film. This action of bismuth element can be called a self-growth-limiting function.

According to the present invention, the oversupply of bismuth element is performed, and the above-described self-growth-limiting function of bismuth element is utilized. These measures make up for the sensitive change, depending on the growth environment, of the proportion of bismuth element being incorporated into thin film crystals, and permit the growth of a thin film free from different crystal phases and without precipitation of impurities. That is, the invention can overcome the problems with conventional growth technologies, and realize the crystal growth of a high quality thin film of a multi-element oxide containing bismuth as a constituent element in a broad growth environment region.

The method of crystal growth relevant to this invention accommodates various kinds of multi-element oxide thin films containing bismuth as a constituent element. This is true of the original constituent elements some of which have been substituted by other elements, or to which other elements have been added.

In an oxide thin film of the present invention, the proportion of oxygen is generally more than or less than in the stoichiometric mixture ratio. Even if this proportion deviates from the stoichiometry, this crystal growth method is effective.

In an oxide thin film of the present invention, also the proportions of the other elements may deviate from the each stoichiometric mixture ratios to the same extent as resulted when a general compound has been produced.

In regard to the constituent elements other than bismuth, when the melting points of oxides of them alone are much higher than the melting point of an oxide of bismuth alone and the vapor pressures of the other elements are very low compared with the vapor pressure of bismuth, this crystal growth method can be utilized particularly effectively. Examples of oxides formed under such conditions are $Bi_2Sr_2CuO_6$, $Bi_4Ti_3O_{12}$, $Bi_2WO_6$ and $Bi_2SrTa_2O_9$.

In the basic embodiment disclosed in FIGS. 1 to 5, the following methods are available for supplying bismuth and other constituent elements in performing the crystal growth method of the present invention:

A first growing method performs the supply of bismuth and the supply of other constituent elements sequentially. This method is characterized in that the growth rate is slow, but a thin film with high crystallinity can be obtained.

A second method is the simultaneous supply of bismuth and other elements. Since the growth rate is fast, this method is excellent in mass producing capacity.

A third method is a combination of the sequential supply method and the simultaneous supply method.

When a plurality of elements are simultaneously supplied, the ratio of bismuth supply is set to be higher than those for other elements. In the case of sequential supply of plural elements, the supply speed of bismuth is increased, or the duration of supply of bismuth is prolonged. By setting these conditions, the oversupply of bismuth can be realized.

Fourthly, it is permissible to stop the supply of bismuth and other constituent elements temporarily during growth, and set a situation in which only an oxidizing gas is supplied. That is, a growth interruption time may be introduced during the growth of a thin film, thereby improving the crystallinity of the thin film. This interruption time may be provided after completion of thin film growth. In other words, annealing is performed in the growth environment represented by the area 401 in FIG. 4, whereby the quality of the resulting thin film can be improved.

Figure 6:
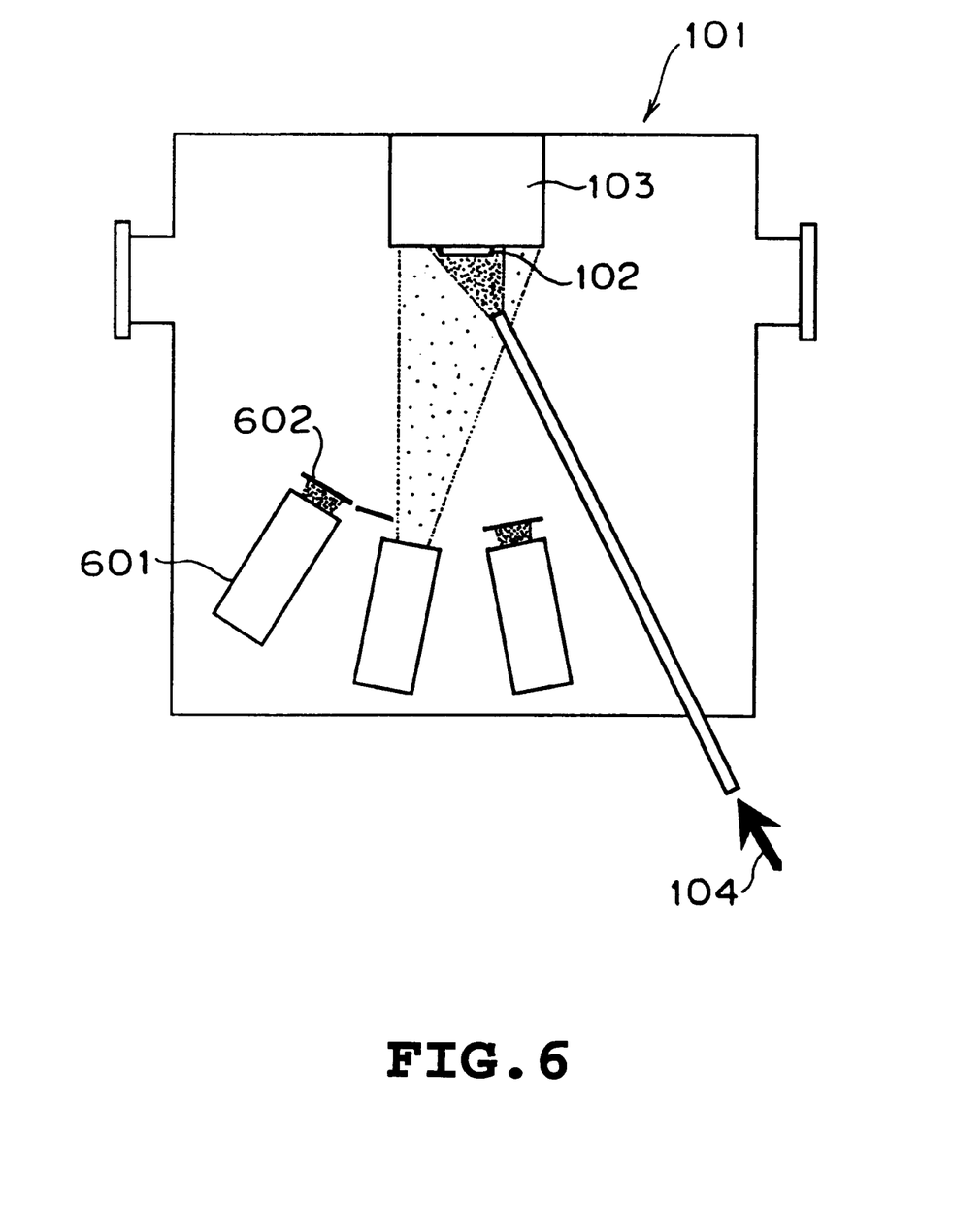
FIG. 6 is a structural view showing an embodiment in which an apparatus for vapor phase epitaxy of a multi-element oxide thin film containing bismuth as a constituent element related to the present invention is an apparatus for molecular beam epitaxy.

FIG. 6 shows an embodiment in which an apparatus 101 for vapor phase epitaxy of a multi-element oxide thin film containing bismuth as a constituent element related to the present invention is an apparatus for molecular beam epitaxy. In FIG. 6, the same components as in the apparatus shown in FIG. 1 are assigned the same numerals to simplify explanation.

The molecular beam epitaxial method uses an effusion cell 601 for generating an atomic flux, and supplies bismuth and other constituent elements individually. For elements with high melting points, an electron gun heater type cell may be used instead of the effusion cell 601. To adjust the amount of the atomic flux, the temperature of the effusion cell 601 or the output of the electron gun is adjusted. A shutter 602 is provided above each of the effusion cells 601 or the electron guns. Thus, the amount of atomic flux can be adjusted depending on the opening time of the shutter 602. In short, to supply bismuth in excess of other elements, it is recommendable to adjust the temperature of the effusion cell 601 for bismuth element to a high value, or to set a long opening time of the shutter 602 for this effusion cell 601.

In the film-forming apparatus of the above constitution, the opening and closing of the shutters 602 above the plurality of effusion cells 601 or electron gun heater type cells are adjusted variously, whereby the method of element supply can be varied in an arbitrary manner.

The following is a description of the results of experiments in which a multi-element oxide thin film containing bismuth as a constituent element and expressed by the chemical formula $Bi_2Sr_2CuO_6$ was prepared by the crystal growth method of the present invention with the use of the embodiment illustrated in FIG. 6.

Figure 7:
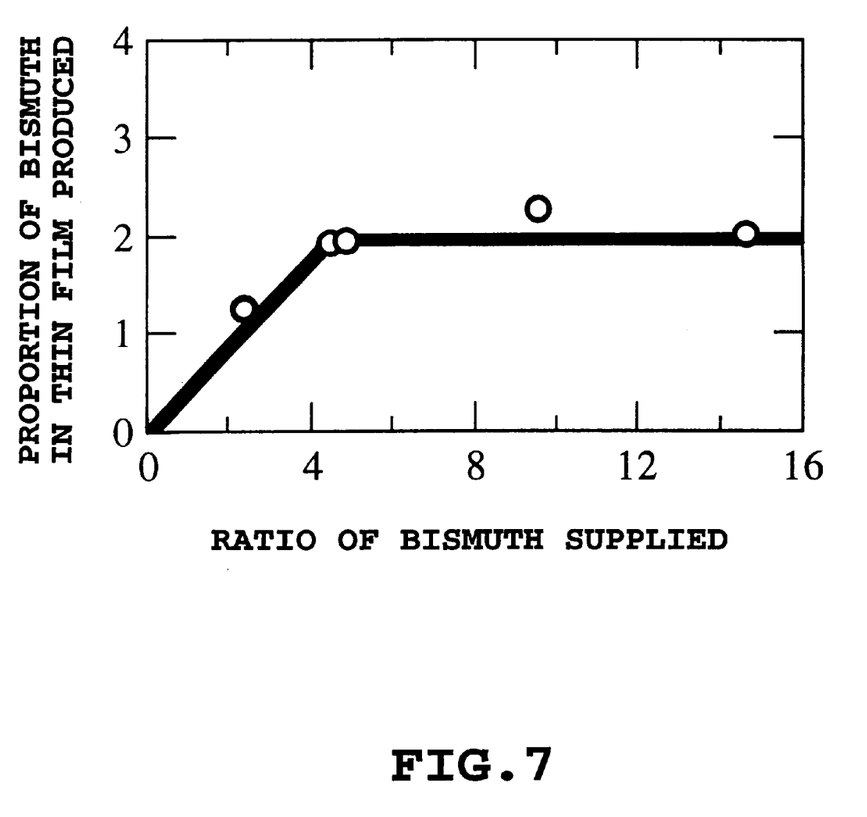
FIG. 7 is a graph showing the relationship between the ratio of bismuth supplied and the proportion of bismuth in the resulting thin film in experiments in which a multi-element oxide thin film containing bismuth as a constituent element and expressed by the chemical formula $Bi_2Sr_2CuO_6$ was prepared by the crystal growth method of the present invention with the use of the embodiment illustrated in FIG. 6.

The constituent elements were supplied by the sequential method. Bismuth was supplied in excess of other constituent elements, and a growth interruption time was introduced after its supply. With regard to a $Bi_2Sr_2CuO_6$ thin film prepared by this method, FIG. 7 shows the relationship between the ratio of supplied bismuth to the total amount charged and the proportion of bismuth in the composition of the resulting thin film. This graph shows that when the supply of bismuth was excessive enough, a thin film grew with the bismuth proportion in the composition expressed by the chemical formula $Bi_2Sr_2CuO_6$. This is proof that the self-growth-limiting function of bismuth worked. The contents of bismuth and other constituent elements in the resulting thin film were measured by inductively coupled plasma atomic emission spectrochemical analysis. The crystallinity of the resulting thin film was evaluated by an X-ray structure analyzer, which demonstrated high crystallinity.

The method of vapor phase epitaxy of a multi-element oxide thin film containing bismuth as a constituent element, which is related to the present invention, may be laser ablation.

The laser ablation method generally directs laser light at a target. Atoms, molecules and clusters excited and liberated from there are caused to fly onto a substrate, growing a thin film. The method uses a single target or a plurality of targets. When a single target is used, it is advisable to make the proportion of bismuth in the composition of the target higher than in the composition of the desired multi-element oxide thin film in order to oversupply bismuth. In case a plurality of targets are used, a long time is set for directing laser light at the bismuth target, whereby the oversupply of bismuth element can be achieved.

By changing the number of the targets or varying the constituent elements of the respective targets, the method of supplying the elements can be modified arbitrarily.

The method of vapor phase epitaxy of a multi-element oxide thin film containing bismuth as a constituent element, which is related to the present invention, may be sputtering.

According to the sputtering method, high energy ions generated in plasma bombard a target. Atoms of the target that have been ejected therefrom fly and deposit on a substrate to grow thin film crystals. Means of oversupplying bismuth element may be to increase the proportion of bismuth in the composition of the target, if the target is single. In the case of a plurality of targets, it is recommendable to adjust plasma so that the target for bismuth element will be sputtered at a higher ratio than will the other targets, or to prolong the time that the substrate passes above the bismuth target.

In this case, the method of supplying the elements can be modified arbitrarily by changing the number of the targets or varying the composition of the constituent elements of the respective targets.

The method of vapor phase epitaxy of a multi-element oxide thin film containing bismuth as a constituent element, which is related to the present invention, may be chemical vapor deposition (CVD).

According to the CVD method, constituent elements are prepared as organometallic molecules at high vapor pressures. These molecules are transported to a thin film growth chamber by means of a gas such as argon. The organometallic molecules are decomposed on a substrate, and organic components fly away. Only metallic elements remain on the substrate to grow a thin film.

To adjust the flow rates of the organometallic molecules of the respective constituent elements, the container for evaporation of the molecules is temperature controlled, or the valve of the pipe for the passage of the molecules is adjusted. That is, for the oversupply of bismuth compared with other elements, it is recommendable that the temperature of the container containing organometallic molecules of bismuth element be adjusted to a high level, or the valve of the pipe for organometallic molecules of bismuth element be adjusted to a wide clearance, or the supply time of organometallic molecules of bismuth element be set to be long.

In the film-forming apparatus of the above constitution, the opening and closing of the valves of the supply pipes for the respective organometallic molecules of a plurality of elements are adjusted variously, whereby an arbitrary element supply method can be achieved.

As stated previously, the method for crystal growth related to the present invention utilizes the self-growth-limiting function of bismuth. The use of this method suppresses the formation of different phases or the precipitation of impurities ascribed to the deviation of the proportion of bismuth element from the desired composition, and thus enables a high quality thin film to be grown.

In comparison with conventional technologies, the present invention can markedly broaden the ranges of the set conditions for the thin film growth temperature and oxidizing gas.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method for crystal growth of a multi-element oxide thin film containing bismuth as a constituent element by vapor phase epitaxy, which comprises setting a growth environment to fall under conditions such that an oxide of bismuth alone will not be formed, but the desired multi-element oxide will be formed; and supplying bismuth in excess of other constituent elements to the growth environment, to suppress the formation of different phases in the multi-element oxide thin film, to prevent the lack of bismuth, and to evaporate surplus bismuth from the thin film.

2. The method for crystal growth as claimed in claim 1, wherein the growth environment is controlled with the growth temperature and the amount of an oxidizing gas supplied being used as control factors to set conditions such that an oxide of bismuth alone will not be formed, but the desired multi-element oxide will be formed.

3. The method for crystal growth as claimed in claim 1, wherein of the composition of the multi-element oxide thin film, the proportion of oxygen deviates from the stoichiometric mixture ratio.

4. The method for crystal growth as claimed in claim 1, wherein the multi-element oxide is an oxide of the chemical formula $Bi_2Sr_2CuO_6$.

5. The method for crystal growth as claimed in claim 1, wherein the multi-element oxide is an oxide of the chemical formula $Bi_4Ti_3O_{12}$.

6. The method for crystal growth as claimed in claim 1, wherein the multi-element oxide is an oxide of the chemical formula $Bi_2WO_6$.

7. The method for crystal growth as claimed in claim 1, wherein the multi-element oxide is an oxide of the chemical formula $Bi_2SrTa_2O_9$.

8. The method for crystal growth as claimed in claim 1, wherein the supply of bismuth and other elements is performed sequentially.

9. The method for crystal growth as claimed in claim 1, wherein the supply of bismuth and other elements is performed simultaneously.

10. The method for crystal growth as claimed in claim 1, wherein the supply of bismuth and other elements is performed by a combination of sequential supply and simultaneous supply.

11. The method for crystal growth as claimed in claim 1, wherein a period of time during which the supply of bismuth and other elements is stopped is provided.

12. The method for crystal growth as claimed in claim 1, wherein the vapor phase epitaxial method is molecular beam epitaxy.

13. The method for crystal growth as claimed in claim 1, wherein the vapor phase epitaxial method is laser ablation.

14. The method for crystal growth as claimed in claim 1, wherein the vapor phase epitaxial method is sputtering.

15. The method for crystal growth as claimed in claim 1, wherein the vapor phase epitaxial method is chemical vapor deposition (CVD).

* * * * *

UNITED STATES PATENT AND TRADEMARK OFFICE
CERTIFICATE OF CORRECTION

PATENT NO. : 6,071,338
DATED : June 6, 2000
INVENTOR(S) : Shigeki Sakai and Shingi Migita Page 1 of 1

It is certified that error appears in the above-identified patent and that said Letters Patent is hereby corrected as shown below:

Column 1,
Line 8, change "fereinto" to -- hereinto --

Signed and Sealed this

Twenty-second Day of June, 2004

JON W. DUDAS
*Acting Director of the United States Patent and Trademark Office*